US012615874B2

(12) United States Patent
Zhang

(10) Patent No.: US 12,615,874 B2
(45) Date of Patent: Apr. 28, 2026

(54) METHOD FOR FORMING SEMICONDUCTOR STRUCTURE

(71) Applicants: Semiconductor Manufacturing International (Beijing) Corporation, Beijing (CN); Semiconductor Manufacturing International (Shanghai) Corporation, Shanghai (CN)

(72) Inventor: Siriguleng Zhang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 570 days.

(21) Appl. No.: 18/038,129

(22) PCT Filed: Dec. 21, 2020

(86) PCT No.: PCT/CN2020/137949
§ 371 (c)(1),
(2) Date: May 22, 2023

(87) PCT Pub. No.: WO2022/133642
PCT Pub. Date: Jun. 30, 2022

(65) Prior Publication Data
US 2024/0063325 A1 Feb. 22, 2024

(51) Int. Cl.
*H10F 71/00* (2025.01)
*H10F 30/221* (2025.01)

(52) U.S. Cl.
CPC ....... *H10F 71/1395* (2025.01); *H10F 30/221* (2025.01)

(58) Field of Classification Search
CPC .... H10F 30/221; H10F 39/026; H10F 39/199; H10F 39/811; H10F 71/1395
See application file for complete search history.

(56) References Cited

U.S. PATENT DOCUMENTS

RE47,208 E * 1/2019 Tsukamoto ........... H10F 39/026
10,867,834 B2 * 12/2020 Tsai ................... H10P 90/1914
(Continued)

OTHER PUBLICATIONS

Written Opinion of the International Searching Authority, PCT/ CN2020/137949, May 6, 2023 (Year: 2023).*

*Primary Examiner* — Andres Munoz
(74) *Attorney, Agent, or Firm* — Anova Law Group, PLLC

(57) ABSTRACT

Method for forming a semiconductor structure includes: providing a first substrate including a first surface and second surface opposite to each other, where the first substrate includes first ions with a first concentration; forming a first epitaxial layer on the first surface of the first substrate, where the first epitaxial layer includes second ions with a second concentration smaller than the first concentration; forming a second epitaxial layer on the first epitaxial layer and a third epitaxial layer located on the second epitaxial layer, where the second epitaxial layer includes third ions with a third concentration and the third epitaxial layer includes fourth ions with a fourth concentration smaller than the third concentration; and thinning the first substrate from the second surface of the first substrate until the surface of the second epitaxial layer is exposed.

20 Claims, 6 Drawing Sheets

(56) References Cited

U.S. PATENT DOCUMENTS

| | | | | |
|---|---|---|---|---|
| 2006/0006488 A1* | 1/2006 | Kanbe | H10P 30/204 | |
| | | | | 257/443 |
| 2009/0200587 A1* | 8/2009 | Venezia | H10F 39/199 | |
| | | | | 257/292 |
| 2010/0159632 A1* | 6/2010 | Rhodes | H10F 39/199 | |
| | | | | 438/57 |
| 2013/0149807 A1* | 6/2013 | JangJian | H10F 39/028 | |
| | | | | 257/E31.127 |
| 2013/0240962 A1* | 9/2013 | Wang | H10F 39/18 | |
| | | | | 257/292 |
| 2016/0141330 A1* | 5/2016 | Wang | H10F 39/026 | |
| | | | | 438/69 |
| 2019/0067525 A1* | 2/2019 | Xu | H10H 20/824 | |
| 2019/0386054 A1* | 12/2019 | Chuang | H10F 39/805 | |
| 2020/0194476 A1* | 6/2020 | Chuang | H10F 39/80 | |

* cited by examiner 102  101

102  101

METHOD FOR FORMING SEMICONDUCTOR STRUCTURE

CROSS-REFERENCE TO RELATED APPLICATION

This application is a national phase entry under 35 U.S.C § 371 of International Application No. PCT/CN2020/137949, filed Dec. 21, 2020, the content of which is incorporated herein by reference in its entirety.

TECHNICAL FIELD

The present disclosure generally relates to the field of semiconductor fabrication technology and, more particularly, relates to a method for forming a semiconductor structure.

BACKGROUND

Image sensors are used to sense radiation (such as optical radiation including, but not limited to, visible light, infrared, ultraviolet, etc.). Image sensors can be classified into back-illuminated (BSI) image sensors and front-illuminated (FSI) image sensors according to the manner they receive radiation.

BSI image sensors are capable of receiving radiation from their backside. Different from the FSI image sensors, in the BSI image sensors, components such as wiring that may affect radiation reception are basically located on a front side of a substrate, while light enters from a back side of the substrate.

At present, a process for forming a BSI image sensor usually includes: growing an epitaxial layer on a substrate; forming a photoelectric sensing device (such as a photodiode) on the epitaxial layer; and then removing the substrate from the backside. During the process, the epitaxial layer is used as a stop layer for removing the substrate. However, in the process of using the substrate and the epitaxial layer on the substrate to form a BSI image sensor, only a portion of the low-doped epitaxial layer will be preserved ultimately, affecting the performance of the final image sensor.

Therefore, there is a need to provide a method for forming a semiconductor structure, which may realize a structure with a low-doped epitaxial layer and a highly-doped substrate.

SUMMARY

The preset disclosure provides a method for forming a semiconductor structure, to improve the performance of the formed semiconductor structure.

To solve the above technical problems, the present disclosure provides a method for forming a semiconductor structure. The method includes: providing a first substrate including a first surface and second surface opposite to each other, where the first substrate includes first ions with a first concentration; forming a first epitaxial layer on the first surface of the first substrate, where the first epitaxial layer includes second ions with a second concentration smaller than the first concentration; forming a second epitaxial layer on the first epitaxial layer and a third epitaxial layer located on the second epitaxial layer, where the second epitaxial layer includes third ions with a third concentration and the third epitaxial layer includes fourth ions with a fourth concentration smaller than the third concentration; and thinning the first substrate from the second surface of the first substrate until the surface of the second epitaxial layer is exposed.

Optionally, thinning the first substrate includes: etching the first substrate from the second surface of the first substrate until the surface of the first epitaxial layer is exposed; and performing planarization treatment on the first epitaxial layer until the surface of the second epitaxial layer is exposed.

Optionally, the etching is a wet etching process, and processing parameters of the wet etching include an etching solution including an HNA solution, wherein the HNA solution is a mixed solution of HF, $HNO_3$, and acetic acid.

Optionally, the planarization treatment is a chemical mechanical polishing; and processing parameters of the chemical mechanical polishing include: a polishing liquid including $SiO_2$, and a polishing time of about 50 to 100 seconds.

Optionally, the first ions have a conductive type opposite to a conductive type of the second ions.

Optionally, the third ions have a conductive type same as a conductive type of the fourth ions.

Optionally, the first ions are P-type ions, and the P-type ions include one or more types of boron ions, indium ions, or gallium ions.

Optionally, the second ions are N-type ions, and the N-type ions include one or more types of phosphorus ions, arsenic ions, or antimony ions.

Optionally, the third ions are P-type ions, and the P-type ions include one or more types of boron ions, indium ions, or gallium ions.

Optionally, the first concentration is in a range of about 2E18~5E18 atoms/cm³.

Optionally, the second concentration is in a range of about 5E12~1E15 atoms/cm³.

Optionally, the third concentration is in a range of about 6E17~5E18 atoms/cm³.

Optionally, the fourth concentration is in a range of about 1E13~2E14 atoms/cm³.

Optionally, a thickness of the first epitaxial layer is about 1 μm to about 3 μm.

Optionally, a thickness of the second epitaxial layer is about 1 μm to about 5 μm.

Optionally, a thickness of the third epitaxial layer is about 4 μm to about 10 μm.

Optionally, the third epitaxial layer includes a third surface, and the third surface faces away from the second epitaxial layer. Before thinning the first substrate, the method further includes: forming a plurality of photoelectric doped regions in the third epitaxial layer; forming a first dielectric layer covering the third surface of the third epitaxial layer and the plurality of photoelectric doped regions; and forming an electrical interconnection structure in the first dielectric layer.

Optionally, after forming the electrical interconnection structure in the first dielectric layer, the method further includes: providing a second substrate, and bonding the first surface of the first substrate to the second substrate.

Optionally, the second epitaxial layer includes a fourth surface, and the fourth surface is in contact with the first epitaxial layer. After thinning the first substrate, the method further includes: forming a second dielectric layer on the fourth surface of the second epitaxial layer; forming a through hole in the second dielectric layer, the second epitaxial layer and the third epitaxial layer, where the through hole exposes the first dielectric layer; forming a contact hole at the bottom of the through hole and in the first dielectric layer, exposing the electrical interconnection structure; and forming a conductive layer in the through hole and the contact hole.

Optionally, the method further includes: forming a plurality of optical filters on the second dielectric layer and lenses on the plurality of optical filters.

Compared to the existing technologies, the solution provided by the present disclosure may have flowing benefits.

A first epitaxial layer, a second epitaxial layer located on the first epitaxial layer, and a third epitaxial layer located on the second epitaxial layer may be formed on a first substrate. A second concentration of second ions in the first epitaxial layer may be smaller than a first concentration of first ions in the first epitaxial layer. A third concentration of third ions in the second epitaxial layer may be larger than a fourth concentration of fourth ions in the third epitaxial layer. When thinning the first substrate, on the one hand, because of the ion concentration difference between the first epitaxial layer and the first substrate, the thinning process may first stop at the interface of the first epitaxial layer and the first substrate. And then the thinning process may be continued until the surface of the second epitaxial layer is exposed, which may be beneficial to control the uniformity of the thinned thickness. Further, after thinning, the second epitaxial layer and the third epitaxial layer may be preserved, and the third concentration may be larger than the fourth concentration. After the pixel units are formed in the third epitaxial layer, a reverse bias voltage may be applied when the pixel units are working. Because of the presence of the second epitaxial layer with a high ion concentration, the formed depletion region may be prevented from expanding to the lattice defects at the interface of the thinning process, the generation of dark electric current may be reduced, which may be beneficial to improve the performance of semiconductor structure.

Further, the conductive types of the first ions and the second ions may be opposite. By forming the first epitaxial layer with a conductive type opposite to the first substrate, the interface between the first substrate and the first epitaxial layer may be clearer, to prevent the interface from be blurred because of ion diffusion in some heat treatment, such that the first epitaxial layer may be able to act as the etching stop layer much better.

DETAILED DESCRIPTION

Figure 1:
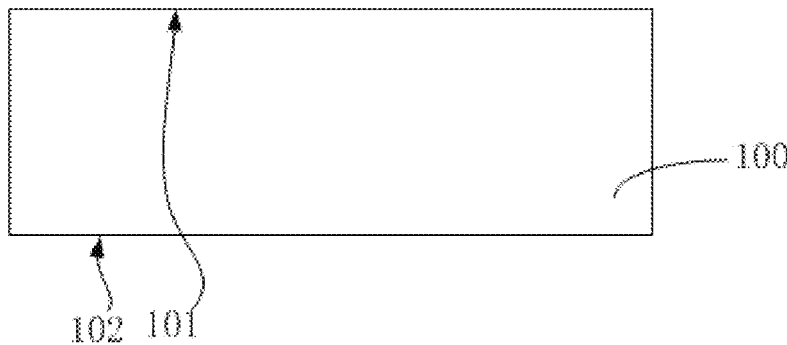
FIGS. 1-8 illustrate structural schematics corresponding to certain stages of a method for forming an exemplary semiconductor structure according to various disclosed embodiments of the present disclosure.

According to the background, a method for forming a BSI image sensor at present includes following process.

A first substrate is provided. The first substrate includes a first surface and a second surface opposite to each other, and the first substrate includes first ions. The first ions have a first concentration. An epitaxial layer is formed on the first surface, and the epitaxial layer includes a third surface and a fourth surface opposite to each other. The fourth surface of the epitaxial layer is in contact with the first surface of the first substrate. The epitaxial layer includes second ions, and the second ions have a second concentration. The second concentration is smaller than the first concentration. A plurality of pixel units isolated from each other, a dielectric layer covering the third surface of the epitaxial layer and the plurality of pixel units, and an interconnection layer in the dielectric layer, are formed on the third surface of the epitaxial layer. Each pixel unit includes a light emitting diode and a plurality of MOS transistors. A second substrate is provided, and the second substrate is bonded in the direction of the first surface to the first substrate. And then the second substrate is turned over such that the second surface of the first substrate faces upward, and the first substrate is thinned from the second surface of the first substrate.

At present, the method of thinning the first substrate usually uses the epitaxial layer as a thinning stop layer. Since the thinning rate is very sensitive to the ion concentration, the thinning rate will suddenly decrease when it is thinned to the concentration gradient layer, such that the thinning stops at the interface of the first substrate and the epitaxial layer. The thinning process with the epitaxial layer as the stop layer eventually completely removes the first substrate, and there are many lattice defects at the interface where the thinning stops, that is, the fourth surface of the epitaxial layer. In the process for finally forming the image sensor, a reverse bias voltage is applied to the light-emitting diode. Therefore, a depletion region is formed in the epitaxial layer. When the applied reverse bias voltage is relatively large, the depletion region extends to the lattice defects of the fourth surface of the epitaxial layer, resulting in the generation of dark current, which is detrimental to the performance of the image sensor.

To prevent the depletion region from extending to the interface where the thinning process stops, it is desired to retain a portion of the first substrate with a relatively high ion concentration without using a thinning process that stops at the epitaxial layer. When thinning the first substrate, it is necessary to control the interface where thinning stops by itself, which easily causes the problem of poor thickness uniformity of the remaining first substrate after thinning and also affects the performance of the sensor.

The present disclosure provides a semiconductor structure and its fabrication method, to at least partially alleviate the above problem. In the semiconductor structure and its fabrication method provided by the present disclosure, a first epitaxial layer, a second epitaxial layer located on the first epitaxial layer, and a third epitaxial layer located on the second epitaxial layer may be formed on a first substrate. A second concentration of second ions in the first epitaxial layer may be smaller than a first concentration of first ions in the first epitaxial layer. A third concentration of third ions in the second epitaxial layer may be larger than a fourth concentration of fourth ions in the third epitaxial layer. When thinning the first substrate, on the one hand, because of the ion concentration difference between the first epitaxial layer and the first substrate, the thinning process may first stop at the interface of the first epitaxial layer and the first substrate. And then the thinning process may be continued until the surface of the second epitaxial layer is exposed, which may be beneficial to control the uniformity of the thinned thickness. Further, after thinning, the second epitaxial layer and the third epitaxial layer may be preserved, and the third concentration may be larger than the fourth concentration. After the pixel units are formed in the third epitaxial layer, a reverse bias voltage may be applied when the pixel units are working. Because of the presence of the second epitaxial layer with a high ion concentration, the formed depletion region may be prevented from expanding to the lattice defects at the interface of the thinning process, the generation of dark electric current may be reduced, which may be beneficial to improve the performance of semiconductor structure.

Reference will now be made in detail to exemplary embodiments of the disclosure, which are illustrated in the accompanying drawings. Wherever possible, the same reference numbers will be used throughout the drawings to refer to the same or like parts.

As shown in FIG. 1, a first substrate 100 may be provided. The first substrate 100 may include a first surface 101 and a second surface 102 opposite to each other. The first substrate 100 may also include first ions, and the first ions may have a first concentration.

The first substrate 100 may be a silicon substrate, a germanium substrate, a germanium silicide substrate, a gallium arsenide substrate, or a silicon-on-insulator substrate. Those skilled in the art may select the substrate type according to needs, so the type of the first substrate should not be considered as a feature that limits the protection scope of the present disclosure. In this embodiment, the first substrate 100 may be a silicon substrate.

In one embodiment, the first substrate 100 may be P-type doped. That is, the first ions may be P-type ions. The P-type ions may include one or more of boron ions, indium ions, or gallium ions.

The first concentration of the first ions may be 2E18~5E18 atoms/cm$^3$.

The thickness of the first substrate 100 may be about 725 μm to about 755 μm. The thickness of the first substrate 100 may be a normal thickness of a substrate in conventional semiconductor process.

Figure 2:
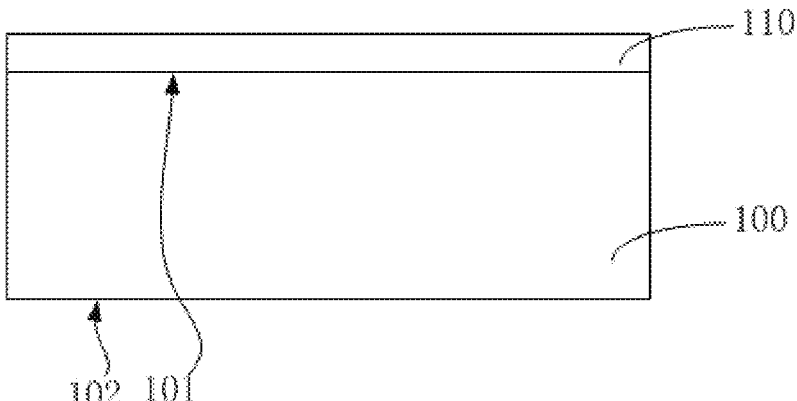

As shown in FIG. 2, a first epitaxial layer 110 may be formed on the first surface 101 of the first substrate 100. The first epitaxial layer 110 may have second ions. The second ions may have a second concentration. The second concentration may be smaller than the first concentration.

The second concentration of the second ions may be 5E12~1E15 atoms/cm$^3$. In this embodiment, the second concentration may be smaller than the first concentration, and there may be a concentration difference at the interface of the first epitaxial layer 110 and the first substrate 100. When the first substrate 100 is thinned subsequently from the second surface 102, the first substrate 100 may be etched first. Since the etching rate is sensitive to ion concentration, the etching rate may drop suddenly in the ion concentration gradient layer, such that the thinning may stop first at the interface of the first epitaxial layer 110 and the first substrate 100, and the uniformity of thinning thickness may be improved.

In one embodiment, the conductivity type of the second ions may be opposite to the conductivity type of the first ions. The reason why the second ions and the first ions adopt the opposite conductivity type is that the boundary between the first epitaxial layer 110 and the first substrate 100 is clearer, avoiding that the boundary becomes blurred because of ion diffusion during some heat treatments. Therefore, when the first substrate 100 is subsequently thinned, the first epitaxial layer 110 may be acted as an etching stop layer better.

In one embodiment, the first ions may be P-type ions, and the second ions may be N-type ions. The N-type ions may include one or more types of phosphorus ions, arsenic ions, or antimony ions.

In some other embodiments, the conductivity types of the first ions and the second ions may be same.

In one embodiment, the first epitaxial layer 110 may be formed by an epitaxial growth method.

The thickness range of the first epitaxial layer 110 may be about 1 μm to about 3 μm. When the thickness of the first epitaxial layer 110 is larger than 3 μm, the second ions may form a concentration gradient layer in the first epitaxial layer 110, which is not beneficial to stop of the subsequent etching process during the thinning process. When the thickness of the first epitaxial layer 110 is less than 1 μm, the planarization process in the subsequent thinning process may easily cause over-grinding and damage the second epitaxial layer 120.

Figure 3:
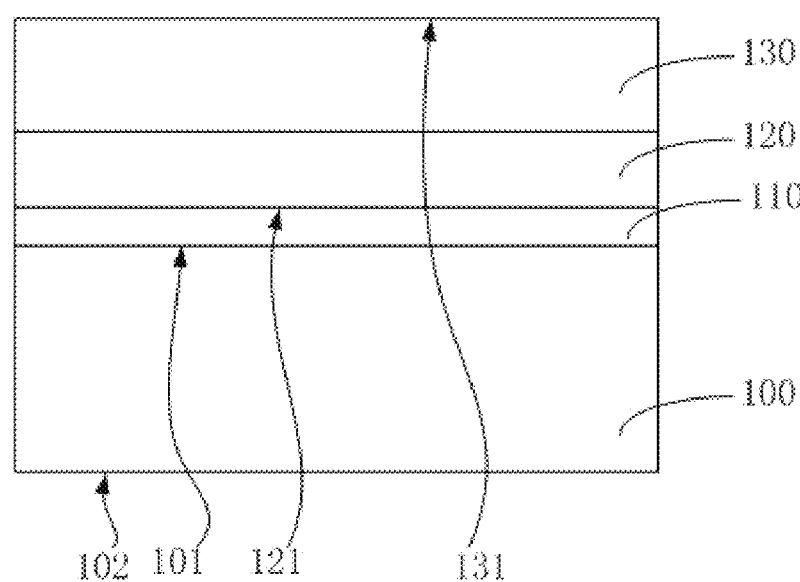

As shown in FIG. 3, a second epitaxial layer 120 and a third epitaxial layer 130 located on the second epitaxial layer 120 may be formed on the first epitaxial layer 110. There may be third ions in the second epitaxial layer 120, and the third ions may have a third concentration. There may be fourth ions in the third epitaxial layer 130 and the fourth ions may have a fourth concentration. The fourth concentration may be smaller than the third concentration.

The third concentration may be in a range of 6E17-5E18 atoms/cm3. The fourth concentration may be in a range of 1E13-2E14 atoms/cm3.

In one embodiment, the third ions and the fourth ions may have the same conductivity type, and the third ions and the fourth ions have the same conductivity type as the first ions.

In one embodiment, the third ions may be P-type ions; the fourth ions may be P-type ions. The P-type ions may include one or more of types of boron ions, indium ions, or gallium ions.

In one embodiment, the reason to form the second epitaxial layer 120 and the third epitaxial layer 130 on the first epitaxial layer 110 may include: after subsequent thinning of the first substrate 100, the first substrate 100 and the first epitaxial layer 110 may be removed until the surface of the second epitaxial layer 120 is exposed, and the remaining second epitaxial layer 120 and the third epitaxial layer 130 may serve as the substrate for forming the semiconductor structure. Further, the third concentration may be larger than the fourth concentration, which meets the requirements of the substrate for forming the image sensor and may improve the performance of the formed semiconductor structure.

In one embodiment, the second epitaxial layer 120 and the third epitaxial layer 130 may be formed by an epitaxial growth process.

The thickness range of the second epitaxial layer 120 may be about 1-5 μm, and the thickness range of the third epitaxial layer 130 may be about 4-10 μm. The thickness of the second epitaxial layer 120 and the third epitaxial layer 130 may be configured according to the actual situation.

The third epitaxial layer 130 may include a third surface 131, and the third surface 131 may face away from the second epitaxial layer 120. The second epitaxial layer 120 may include a fourth surface 121, and the fourth surface 121 may be in contact with the first epitaxial layer 110.

Figure 4:
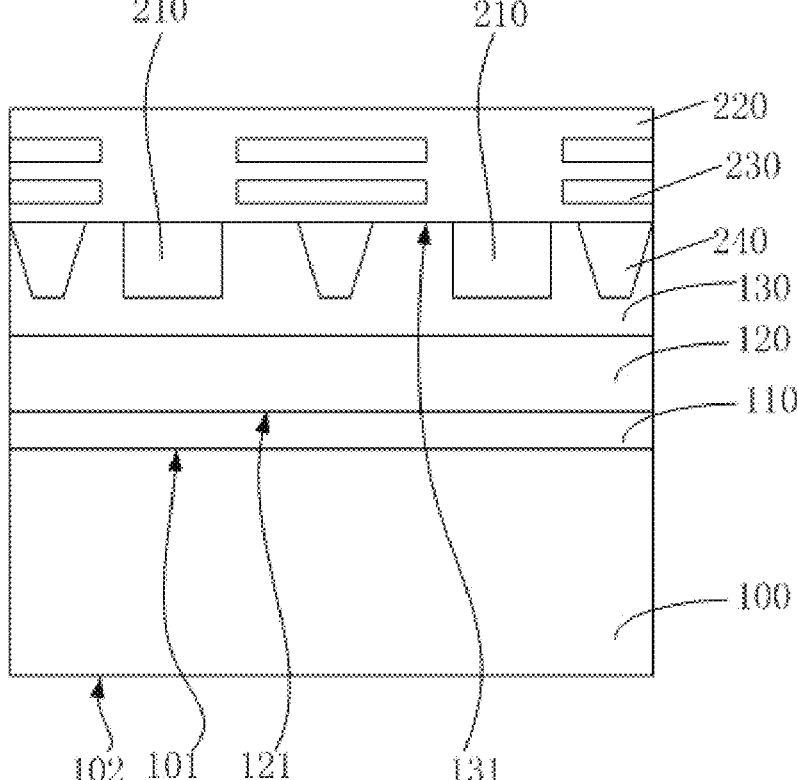

As shown in FIG. 4, after forming the third epitaxial layer 130, a plurality of photoelectric doped regions 210 may be formed in the third epitaxial layer 130. Adjacent photoelectric doped regions 210 may be isolated by shallow groove isolation structures 240.

In one embodiment, the method may further include: forming a first dielectric layer 220 covering the third surface 131 of the third epitaxial layer 130 and the plurality of photoelectric doped regions.

In one embodiment, the method may further include: forming a logic circuit (not shown) in the first dielectric layer 220. The logic circuit may include a MOS transistor and an electrical interconnection structure 230 electrically connected to the MOS transistor, and the electrical signals in the MOS transistor may be transmitted through the electrical interconnection structure 230.

In one embodiment, the plurality of photoelectric doped regions 210 may be formed by:

Forming a patterned layer (not shown) on the third surface 131 of the third epitaxial layer 130 where the patterned layer exposes a portion of the third surface 131 of the third epitaxial layer 130; and performing ion implantation with the patterned layer as a mask to form the plurality of photoelectric doped regions 210 in the third epitaxial layer 130.

The doping type of the plurality of photoelectric doped regions 210 may be opposite to the doping type of the third epitaxial layer 130. For example, the third epitaxial layer 130 may be P-type doped and the plurality of photoelectric doped regions 210 may be N-type doped, or vice versa. Therefore, in a direction perpendicular to the third surface 131 of the third epitaxial layer 130, a PN junction may be formed between one photoelectric doped region 210 and the third epitaxial layer 130 to form a photodiode.

In one embodiment, the electrical interconnection structure 230 may include stacked multilayer interconnection metal layers and a plug layer (not shown) connecting two adjacent interconnection metal layers. The interconnection metal layers may be located over the shallow groove isolation structures 240. The method for forming the electrical interconnection structure 230 is well known to those skilled in the art, and will not be repeated here.

Figure 5:
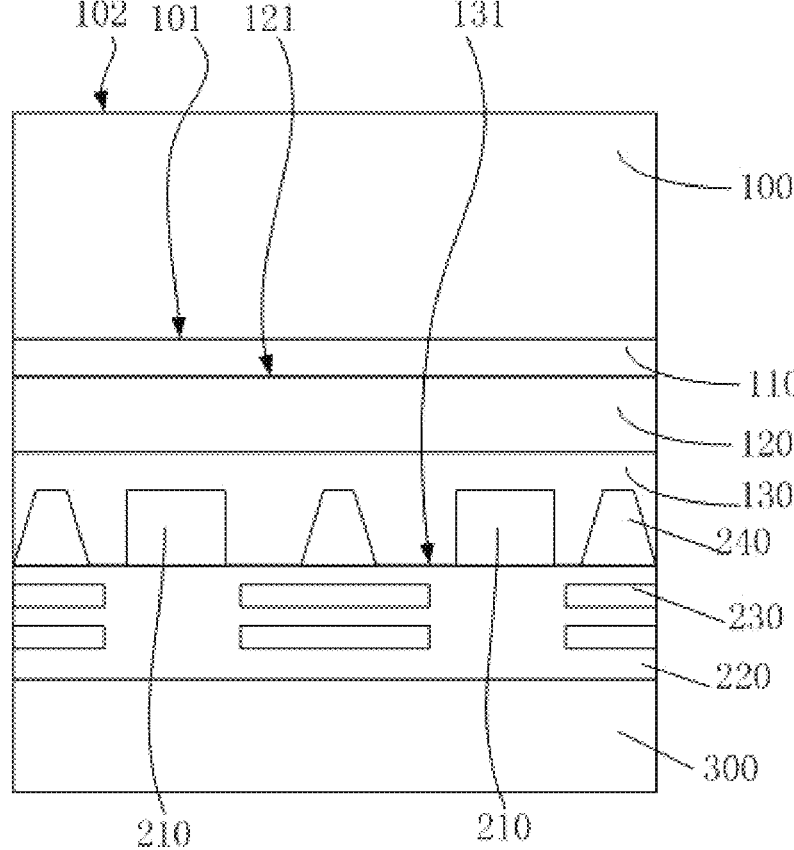

As shown in FIG. 5, a second substrate 300 may be provided, and then the second substrate 300 may be bonded to the first substrate 100 in the direction of the first surface 101. The first substrate 100 may be turned over such that the second surface 102 faces upward. The bonding method may be eutectic bonding, or any other soldering process that is feasible in the semiconductor process.

After turning over the first substrate 100, the first substrate 100 may be thinned from the second surface 102. Specifically, the thinning may include the following processes.

Figure 6:
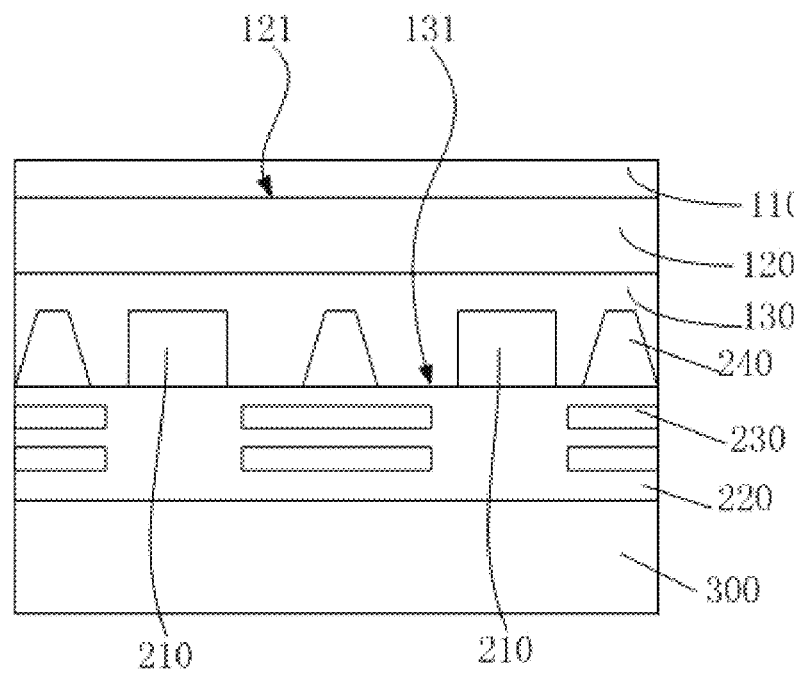

As shown in FIG. 6, the first substrate 100 may be etched from the second surface 102 of the first substrate 100 until the surface of the first epitaxial layer 110 is exposed.

In one embodiment, the etching process may be a wet etching process. The process parameters of the wet etching process may include: the etching solution including an HNA solution, where the HNA solution is composed of hydrofluoric acid, nitric acid and a mixed solution of acetic acid.

In one embodiment, since the first epitaxial layer 110 and the first substrate 100 have an ion concentration difference and the wet etching process is very sensitive to ion concentration, the etching rate may drop sharply at a position where the concentration changes. Therefore, during the etching process, the first epitaxial layer 110 may be able to act as an etching stop layer to stop the wet etching at the interface of the first substrate 100 and the first epitaxial layer 110, improving the uniformity of thinning thickness.

Figure 7:
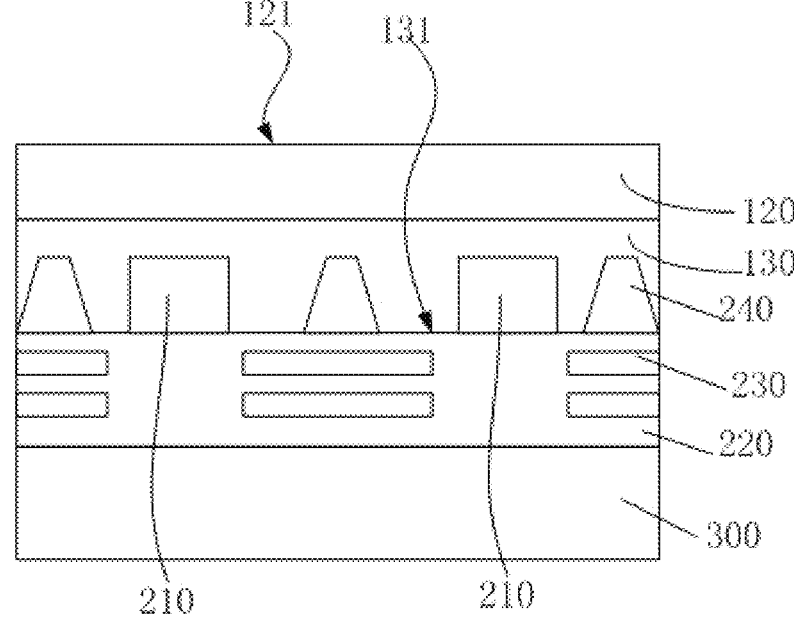

As shown in FIG. 7, the first epitaxial layer 110 may be subsequently planarized until the surface of the second epitaxial layer 120 is exposed.

In one embodiment, the planarization may be chemical mechanical polishing; and the process parameters of the chemical mechanical polishing may include: a polishing liquid including SiO2 and the polishing time of 50-100 seconds.

In one embodiment, chemical mechanical polishing may be beneficial to further improve the thickness uniformity of the thinning process.

In one embodiment, the thickness of the chemical mechanical polishing may be the thickness of the first epitaxial layer 110, and the thickness range of the first epitaxial layer 110 may be about 1-3 μm. When the thickness of the first epitaxial layer 110 is larger than 3 μm, the second ions may form a concentration gradient layer in the first epitaxial layer 110, which is not beneficial to stop of the subsequent etching process during the thinning process. When the thickness of the first epitaxial layer 110 is less than 1 μm, the planarization process in the subsequent thinning process may easily cause over-grinding and damage the second epitaxial layer 120.

In one embodiment, after the first epitaxial layer 110 is planarized, the exposed surface of the second epitaxial layer 120 may be guaranteed to be flat, which may be beneficial to the performance of the finally formed semiconductor structure.

In one embodiment, after the first epitaxial layer 110 is planarized, the method may further include: treating the exposed surface of the second epitaxial layer 120 with a TMAH solution, such that the crystal orientation of the silicon in the surface of the second epitaxial layer 120 is consistent, which may be beneficial to further improving the flatness of the surface of the second epitaxial layer 120 after the thinning process.

In one embodiment, after thinning the first substrate 100, the first substrate 100 and the first epitaxial layer 110 may be removed, and the second epitaxial layer 120 and the third epitaxial layer 130 may be preserved. Pixel units may be formed on the third surface 131 of the third epitaxial layer 130. In the final formed semiconductor structure, a reverse bias voltage may be applied to a photodiode during operation, thereby forming a depletion region in the third epitaxial layer 130. When the applied reverse bias voltage is large, the depletion region may be easy to expand. By retaining the second epitaxial layer 120 with a large ion concentration, the expansion of the depletion region may be suppressed, and the depletion region may be prevented from extending to the processing area to generate dark current at the interface defects of the thinning process. The performance of the final formed semiconductor structure may be improved.

Figure 8:
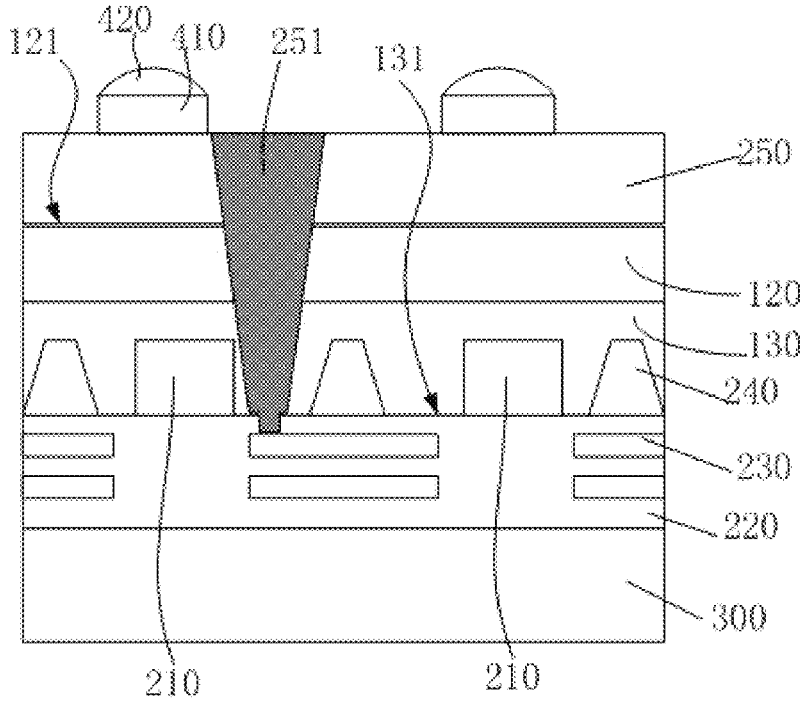

As shown in FIG. 8, after thinning, a second dielectric layer 250 may be formed on the fourth surface 121 of the second epitaxial layer 120. The second dielectric layer may cover the fourth surface 121 of the second epitaxial layer 120 to protect the fourth surface 121 of the second epitaxial layer 120.

In one embodiment, the second dielectric layer 250 may have a single-layer structure, and may include a silicon oxide layer, a silicon nitride layer, or another feasible dielectric material.

In other embodiments, the second dielectric layer 250 may be a stack structure, and may include a silicon oxide layer and a silicon nitride layer on the silicon oxide layer.

As shown in FIG. 8, a conductive plug 251 may be formed in the second dielectric layer 250, the second epitaxial layer 120 and the third epitaxial layer 130. The conductive plug 251 may be electrically connected to the interconnect metal layers in the electrical interconnection structure 230.

In one embodiment, the conductive plug 251 may be formed by: forming a through hole (not shown in the figure) in the second dielectric layer 250, the second epitaxial layer 120, and the third epitaxial layer 130, where the through hole is located above the interconnect metal layers in the electrical interconnection structure 230 in the first dielectric layer 220 and exposes the first dielectric layer 220; forming a contact hole (not shown in the figure) at the bottom of the through hole and in the first dielectric layer 220, exposing the interconnection metal layers in the electrical interconnection structure 230; and forming a conductive layer in the through hole and the contact hole.

In one embodiment, the conductive layer may be formed by: forming a conductive material (not shown) on the second dielectric layer 250, in the through hole, and in the contact hole, where the conductive material fills the through hole and contact hole and covers the second dielectric layer 250 for subsequently forming the conductive layer; and removing a portion of the conductive material outside the through hole by photolithography or dry etching process, such that a remaining portion of the conductive material in the through hole and the contact hole is used as the conductive layer.

In one embodiment, the conductive plug 251 may serve as an electrical connection, to transmit the electrical signal in the electrical interconnection structure 230 on the third surface 131 of the third epitaxial layer 130 to a peripheral circuit.

As shown in FIG. 8, a plurality of optical filters 410 and lenses 420 located on the plurality of optical filters 410 may be formed on the second dielectric layer 250. The plurality of optical filters 410 and the plurality of pixel units 210 may be aligned in a one-to-one correspondence in a direction perpendicular to the third surface 131 of the third epitaxial layer, to ensure that the incident light can be accurately captured.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:

providing a first substrate, the first substrate including a first surface and second surface opposite to each other, wherein the first substrate includes first ions and the first ions have a first concentration;

forming a first epitaxial layer on the first surface of the first substrate, wherein the first epitaxial layer includes second ions and the second ions have a second concentration and the second concentration is smaller than the first concentration;

forming a second epitaxial layer on the first epitaxial layer and a third epitaxial layer located on the second epitaxial layer, wherein: the second epitaxial layer includes third ions, the third ions have a third concentration, the third epitaxial layer includes fourth ions, the fourth ions have a fourth concentration, and the fourth concentration is smaller than the third concentration; and thinning the first substrate from the second surface of the first substrate until a surface of the second epitaxial layer is exposed.

2. The method according to claim 1, wherein thinning the first substrate includes:

etching the first substrate from the second surface of the first substrate until a surface of the first epitaxial layer is exposed; and performing planarization treatment on the first epitaxial layer until the surface of the second epitaxial layer is exposed.

3. The method according to claim 2, wherein:

the etching is a wet etching process, and processing parameters of the wet etching include an etching solution including an HNA solution, wherein the HNA solution is a mixed solution of HF, $HNO_3$, and acetic acid.

4. The method according to claim 2, wherein:

the planarization treatment is a chemical mechanical polishing; and processing parameters of the chemical mechanical polishing include: a polishing liquid including $SiO_2$, and a polishing time of about 50 to 100 seconds.

5. The method according to claim 1, wherein:

the first ions have a conductive type opposite to a conductive type of the second ions.

6. The method according to claim 5, wherein:

the first ions are P-type ions, and the P-type ions include one or more types of boron ions, indium ions, or gallium ions.

7. The method according to claim 5, wherein:

the second ions are N-type ions, and the N-type ions include one or more types of phosphorus ions, arsenic ions, or antimony ions.

8. The method according to claim 1, wherein:

the third ions have a conductive type same as a conductive type of the fourth ions.

9. The method according to claim 8, wherein:

the third ions are P-type ions, and the P-type ions include one or more types of boron ions, indium ions, or gallium ions.

10. The method according to claim 1, wherein:

the first concentration is in a range of about 2E18~5E18 atoms/cm³.

11. The method according to claim 1, wherein:

the second concentration is in a range of about 5E12~1E15 atoms/cm³.

12. The method according to claim 1, wherein:

the third concentration is in a range of about 6E17~5E18 atoms/cm³.

13. The method according to claim 1, wherein:

the fourth concentration is in a range of about 1E13~2E14 atoms/cm³.

14. The method according to claim 1, wherein:

a thickness of the first epitaxial layer is about 1 μm to about 3 μm.

15. The method according to claim 1, wherein:

a thickness of the second epitaxial layer is about 1 μm to about 5 μm.

16. The method according to claim 1, wherein:

a thickness of the third epitaxial layer is about 4 μm to about 10 μm.

17. The method according to claim 1, wherein:

the third epitaxial layer includes a third surface, and the third surface faces away from the second epitaxial layer; and before thinning the first substrate, the method further includes: forming a plurality of photoelectric doped regions in the third epitaxial layer; forming a first dielectric layer covering the third surface of the third epitaxial layer and the plurality of photoelectric doped regions; and forming an electrical interconnection structure in the first dielectric layer.

18. The method according to claim 17, after forming the electrical interconnection structure in the first dielectric layer, further comprising: providing a second substrate, and bonding the first surface of the first substrate to the second substrate.

19. The method according to claim 18, wherein:

the second epitaxial layer includes a fourth surface, wherein the fourth surface is in contact with the first epitaxial layer; and after thinning the first substrate, the method further includes: forming a second dielectric layer on the fourth surface of the second epitaxial layer; forming a through hole in the second dielectric layer, the second epitaxial layer and the third epitaxial layer, wherein the through hole exposes the first dielectric layer; forming a contact hole at a bottom of the through hole and in the first dielectric layer, exposing the electrical interconnection structure; and forming a conductive layer in the through hole and the contact hole.

20. The method according to claim 19, further comprising:

forming a plurality of optical filters on the second dielectric layer and lenses on the plurality of optical filters.

* * * * *